(12) United States Patent
Kuan et al.

(10) Patent No.: US 7,888,868 B2
(45) Date of Patent: Feb. 15, 2011

(54) LED LIGHT SOURCE WITH LIGHT-DIRECTING STRUCTURES

(75) Inventors: Yew Cheong Kuan, Penang (MY); Siew It Pang, Penang (MY); Ng Fook Chuin, Penang (MY); Tong Fatt Chew, Penang (MY); Thye Linn Mok, Penang (MY)

(73) Assignee: Avago Technologies General IP (Singapore) Pte. Ltd.

( * ) Notice: Subject to any disclaimer, the term of this patent is extended or adjusted under 35 U.S.C. 154(b) by 850 days.

(21) Appl. No.: 11/413,568

(22) Filed: Apr. 28, 2006

(65) Prior Publication Data

US 2007/0252163 A1      Nov. 1, 2007

(51) Int. Cl.
*H01L 51/50*       (2006.01)
*H01L 33/00*       (2006.01)

(52) U.S. Cl. .......................... 313/512; 257/98

(58) Field of Classification Search .......... None
See application file for complete search history.

(56) References Cited

U.S. PATENT DOCUMENTS

| | | | |
|---|---|---|---|
| 5,998,925 A * | 12/1999 | Shimizu et al. | 313/503 |
| 2002/0048088 A1 * | 4/2002 | Kashima et al. | 359/599 |
| 2003/0038295 A1 * | 2/2003 | Koda | 257/98 |
| 2003/0089914 A1 * | 5/2003 | Chen | 257/79 |
| 2005/0002204 A1 * | 1/2005 | Lin et al. | 362/551 |
| 2005/0201109 A1 * | 9/2005 | Shimura | 362/382 |
| 2006/0027828 A1 * | 2/2006 | Kikuchi | 257/99 |
| 2006/0050533 A1 * | 3/2006 | Yang et al. | 362/613 |
| 2006/0267037 A1 * | 11/2006 | Lim et al. | 257/98 |

\* cited by examiner

*Primary Examiner*—Toan Ton
*Assistant Examiner*—Britt D Hanley

(57) ABSTRACT

A light source that has improved light mixing. The light source uses a nanolens layer in conjunction with an LED light source to enhance the mixing of the colored light emitting from the LED light source.

4 Claims, 2 Drawing Sheets

LED LIGHT SOURCE WITH LIGHT-DIRECTING STRUCTURES

CROSS-REFERENCE TO RELATED APPLICATIONS

Not applicable.

TECHNICAL FIELD

The invention relates in general to a light-emitting diode light source, and is specifically a light-emitting diode light source that comprises a nanolens layer in association with an encapsulated light emitting diode chip to improve light mixing.

BACKGROUND OF THE INVENTION

Light-emitting diodes generally emit light in a specific color or range of wavelengths. To produce a white light, it is usually necessary to combine or mix the light from plural LEDs which emit different colors, for example, red, green and blue. Initially, light mixing was accomplished by placing LEDs of different colors next to each other such that the light emitted by each LED would mix with the light from the others. A common structure associated with such mixing is a light guide.

This approach has several drawbacks including poor color mixing, uneven light intensity, and the presence of dark regions near the edges of the light guide plate.

Several techniques have been made to improve the light mixing needed to produce which light. One is the insertion of the LEDs into a mixing cavity within the light guide. Another is the use of a light diffusor to mix the colors. While these techniques have resulted in slightly better color mixing, there remains a need for further improvement.

BRIEF SUMMARY OF THE INVENTION

An embodiment of the invention is a novel light emitting diode light source having an associated nanolens structure. The nanolens allows for improved mixing of the light generated by the light-emitting diodes contained within the light source. Light mixing may be further enhanced through the use of a diffusant layer within the light source and/or reflectors placed adjacent to the diodes.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
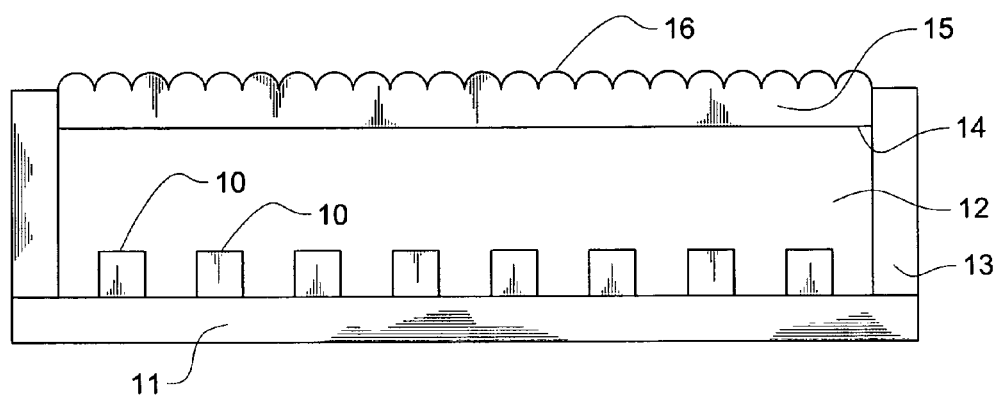
FIG. 1 is a cross-section of one embodiment of the invention.

FIG. 1 shows an embodiment of the invention. In this embodiment, light emitting diode chips 10 are attached to a substrate 11 and at least partially encapsulated with an encapsulant 12. Depending on the nature of the encapsulant 12, a casing 13 may be used to support the encapsulant 12. Associated with the upper surface 14 of the encapsulant 12 is a nanolens layer 15. The nanolens layer is designed to redirect light generated by chips 11 causing mixing of the light. The mixing may occur in a number of regions including within the nanolens layer 15, within the encapsulant 12, within a space between the light source and a light guide, or any combination of these regions.

The light-directing nanolens layer 15 may be formed by nano imprinting the surface of the encapsulant 12 to produce the desired structures, or it may comprise a separate layer of material which has been shaped to have the desired structures. This separate nanolens layer will typically be prepared from a transparent polymeric material. Where the nanolens layer is formed separately, an adhesion promoter may be used to ensure binding to the encapsulant layer. The surface of the nanolens layer 15 will have multiple light-directing structures 16 which redirect the light, causing mixing of the light. While these structures may be dome shaped or hemispherical as shown in FIG. 1, any shape which redirects and/or focuses light may be used. For example, a frustoconical shape may be employed.

The encapsulant used in the practice of the invention should be optically clear and protect the light-emitting diode chips from the environment. In one embodiment, epoxy resins are used as the encapsulant, however, other materials, such as silicones may be used.

Figure 2:
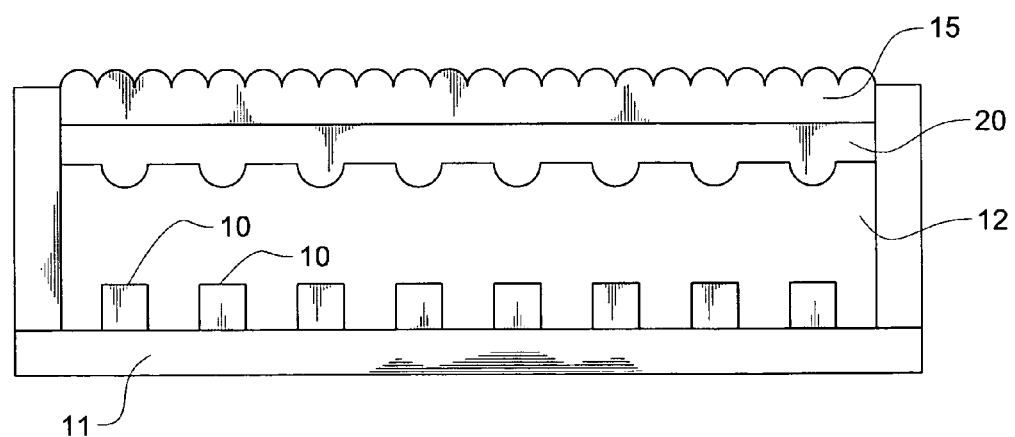
FIG. 2 is a cross-section of an alternate embodiment of the invention.
Figure 3:
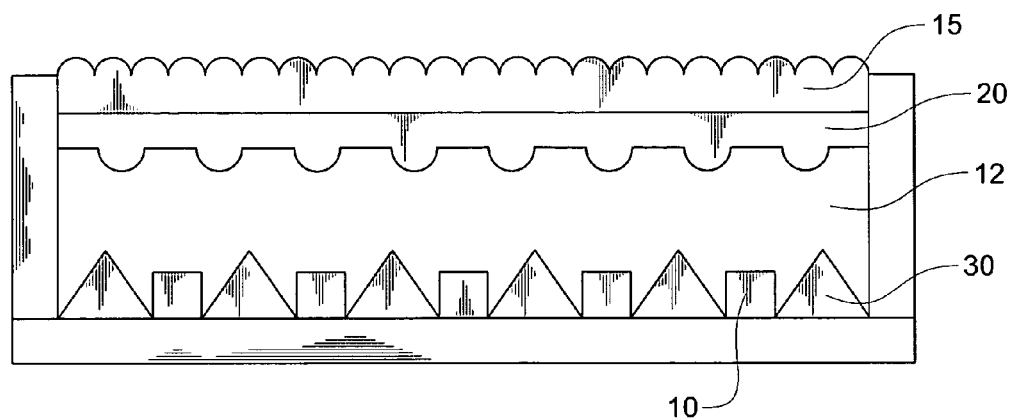
FIG. 3 is a cross-section of a third embodiment of the invention.

In an alternate embodiment shown in FIG. 2, another light-directing layer is used to mix the light. Diffusant 20 is located between the encapsulant 12 and the nanolens layer 15. Diffusant 20 further enhances the light mixing. In this embodiment, the light is first mixed by the diffusant layer 20 and then further mixed by the nanolens layer 15. As shown in FIGS. 2 and 3, the diffusant may comprise another nanolens array having light-directing structures that comprise a lens for each diode chip 10. Note that the lens array on the diffusant 20 may comprise more or fewer lenses than the number of diode chips. Further note that other diffusing structures may be used.

FIG. 3 shows yet another embodiment of the invention. In this embodiment, reflectors 30 are placed adjacent to the light emitting diode chips 10 to further enhance the mixing of the light. In this embodiment the light is first mixed by the reflectors in the encapsulant layer 12 and then by nanolens layer 15. An optional diffusant layer 20 like that described above may also be employed to further mix the light. Note that the reflectors may have other shapes.

Figure 4:
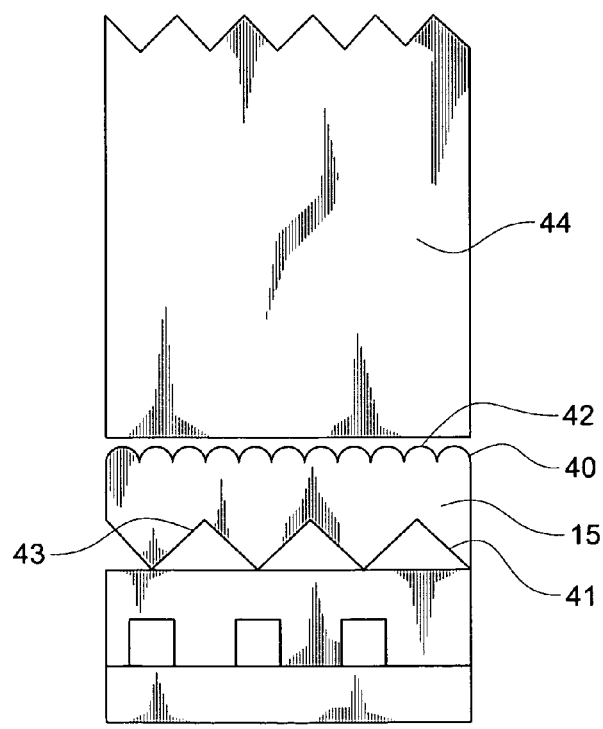
FIG. 4 is a cross-section of a fourth embodiment of the invention with its associated light guide.

Still another embodiment is shown in FIG. 4. In this embodiment, light directing structures are provided on both the outer surface 40 and inner surface 41 of the nanolens layer 15. The shape of the light directing structures on the inner and outer surfaces may be the same or different. For example, as shown in FIG. 4, dome shaped structures 42 are provided on the outer surface 40 while saw tooth structures 43 are provided on the inner surface. In this embodiment, the light directing structure on the outer surface of the nanolens should be capable of directing the mixed light into a light guide 44.

As with the embodiments shown in FIGS. 2 and 3, a diffusant layer and/or reflectors may be employed in this embodiment to further enhance light mixing.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light source comprising:
   a plurality of light emitting diode chips mounted on a surface of a substrate;
   an encapsulant that at least partially encapsulates said chips;
   a first light-directing layer comprising a first surface having a lens array thereon facing away from the light emitting diode chips and a second surface opposite the first surface, wherein the lens array is comprised of a plurality of adjacent lenses for each of the light emitting diode chips; and
   a second light-directing layer positioned between the encapsulant and first light-directing layer, the second light-directing layer comprising a first surface having a plurality of diffusing light-directing structures thereon facing toward the light emitting diodes and a second surface opposite the first surface, wherein the second surface of the second light-directing layer is directly adjacent to the second surface of the first light-directing layer, and wherein each diffusing light-directing structure is aligned, in a direction normal to said surface of said substrate, with one of said light emitting diode chips;
   wherein each of the lens array and the plurality of diffusing light-directing structures redirects light from the light emitting diode chips, thereby mixing the light.

2. The light source of claim 1 wherein said lens array and said diffusing light-directing structures on the first surface of each of the first light-directing layer surface and the second light-directing layer surface are dome-shaped.

3. An optical device comprising:
   a light guide; and
   a light source associated with a light entry edge of said light guide wherein said light source comprises:
      a plurality of light emitting diode chips attached to a surface of a substrate;
      an encapsulant at least partially encapsulating said chips; and
      a light-directing layer associated with an outer surface of said encapsulant and positioned below the light guide and above the chips, said light-directing layer comprising:
         a first surface having lens array thereon facing away from the light emitting diode chips, wherein the lens array is comprised of a plurality of adjacent lenses for each of the light emitting diode chips; and
         a second surface opposite the first surface and positioned between the encapsulant and the first surface, the second surface having a plurality of diffusing light-directing structures thereon facing toward the light emitting diode chips;
      wherein each of the lens array and plurality of diffusing light-directing structures redirects light from the chips, thereby mixing the light before entering the light guide; and
      wherein each of the diffusing light-directing structures is aligned, in a direction normal to said surface of said substrate, with one of said plurality of light emitting diode chips.

4. The device of claim 3 wherein said plurality of adjacent lenses on the first surface of the light-directing layer are dome-shaped.

* * * * *